United States Patent [19]

Stendardo

[11] Patent Number: 4,549,179

[45] Date of Patent: Oct. 22, 1985

[54] APPARATUS FOR REMOTE CONTROL OF VOLUME AND POWER ON ELECTRONIC EQUIPMENT POSSESSING AN AUDIO OUTPUT

[76] Inventor: William J. Stendardo, 664 Youngs Ct., San Jose, Calif. 95127

[21] Appl. No.: 472,389

[22] Filed: Mar. 4, 1983

[51] Int. Cl.[4] .......................... H04Q 9/00; H04B 1/40
[52] U.S. Cl. ..................... 340/825.69; 340/825.25; 455/603; 381/85
[58] Field of Search .......... 340/825.69, 825.2, 825.25; 455/355, 140, 603, 4; 381/105, 85

[56] References Cited

U.S. PATENT DOCUMENTS

| | | | |
|---|---|---|---|
| 2,255,390 | 9/1941 | Martin | 455/355 |
| 3,398,240 | 8/1968 | Owens | 381/85 |
| 4,228,402 | 10/1980 | Plummer | 381/105 |
| 4,291,141 | 9/1981 | Muller | 455/603 |
| 4,425,647 | 1/1984 | Collins et al. | 455/603 |

*Primary Examiner*—Donald J. Yusko
*Attorney, Agent, or Firm*—Alan H. MacPherson; Richard Franklin; Steven F. Caserza

[57] ABSTRACT

A self-contained remote control unit for use on electronic equipment processing on audio output such as home entertainment equipment (i.e. a television receiver, whether black and white or color, an AM radio, an FM radio, an AM/FM radio, or an audio magnetic tape player) comprises an externally mounted remote control receiver which connects to the home entertainment equipment through the earphone connector of said equipment and thereby disables the speakers of said equipment. The remote control receiver unit includes its own speaker which replaces the disabled internal speaker of the equipment to be controlled, a programmable audio power amplifier for driving its speaker, and an on/off triac which supplies AC power to the equipment to be controlled when said equipment's AC power cable is connected to an AC receptacle on the receiver. A battery-operated, hand-held, hand-operated remote control transmitter is used to send wireless information to the remote control receiver. The remote control transmitter unit includes a keyboard, a remote control encoder, and an output circuit.

10 Claims, 10 Drawing Figures

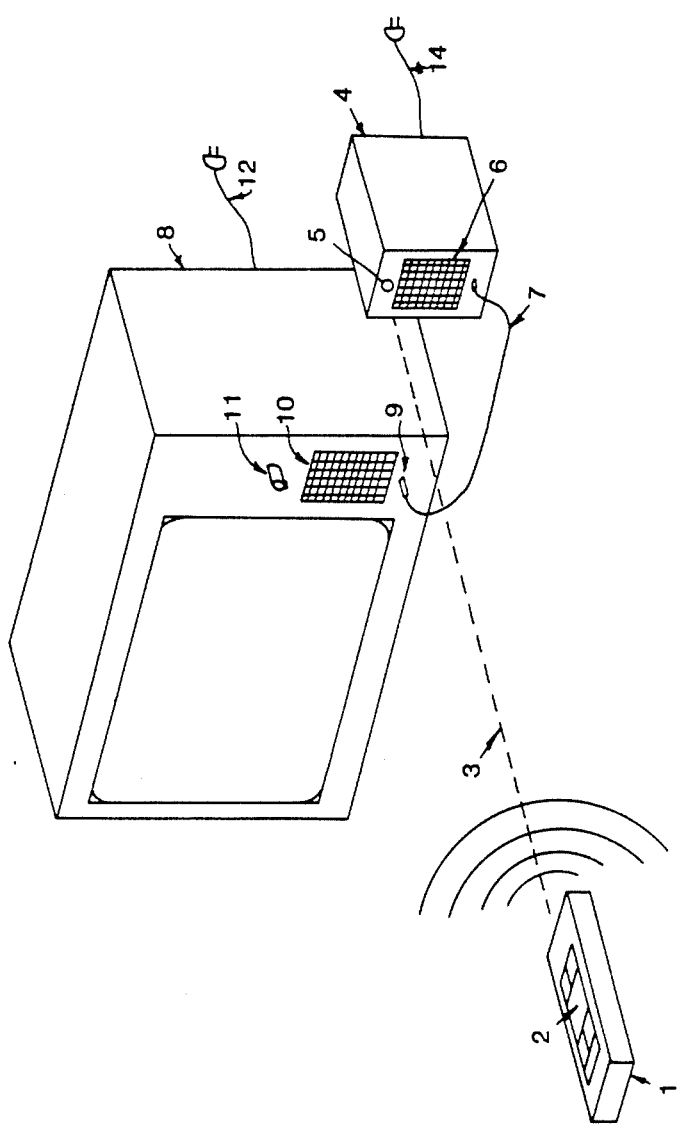
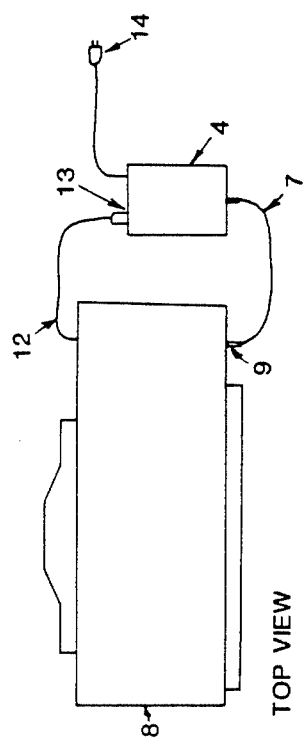

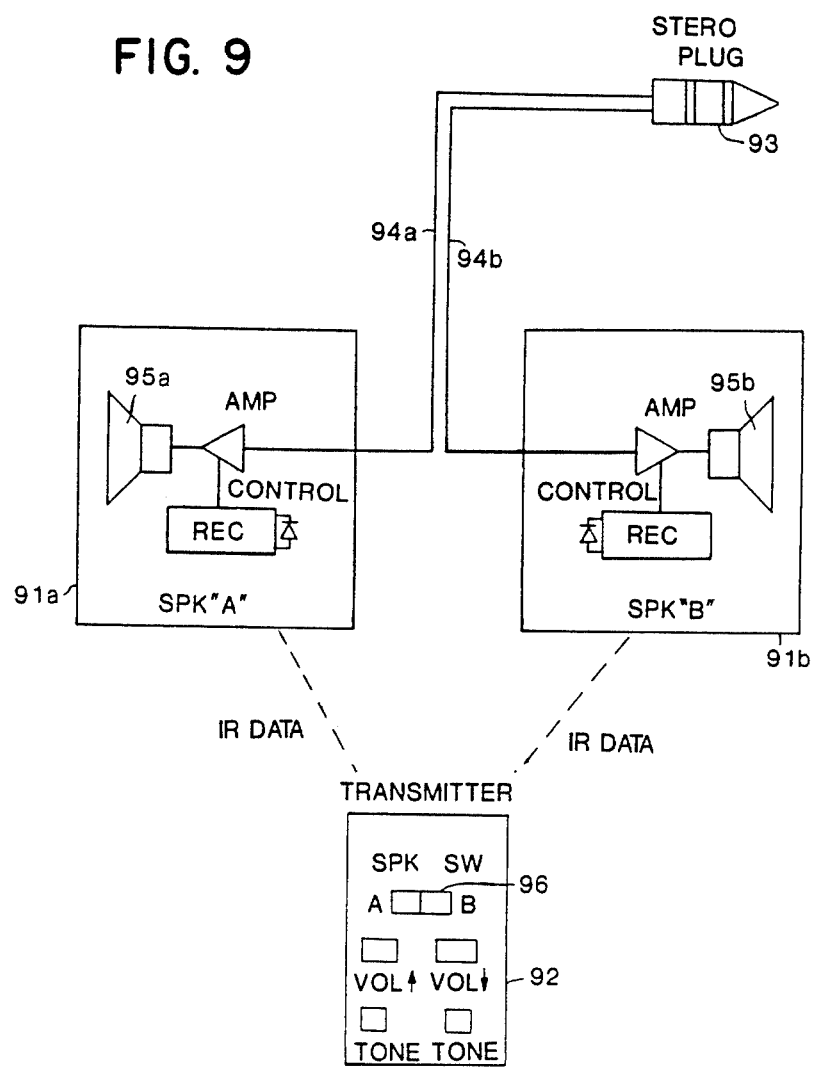

APPARATUS FOR REMOTE CONTROL OF VOLUME AND POWER ON ELECTRONIC EQUIPMENT POSSESSING AN AUDIO OUTPUT

BACKGROUND OF THE INVENTION

1. Field of the Invention

This invention relates to a remote control system for remotely controlling the audio volume on electronic equipment having an audio output and particularly on electronic home entertainment equipment possessing an earphone connection. More particularly, this invention relates to a structure for remotely controlling any piece of home entertainment equipment which possesses a plug-in receptable for an earphone by utilizing the earphone connector of said equipment in such a manner as to require no internal connection or wire connections between the remote control transmitter and the equipment to be controlled.

2. Description of the Prior Art

Many pieces of home entertainment equipment, such as television receivers, incorporate as an integral, non-removable part thereof a remote control system for allowing a user to control the volume and other functions of said equipment from a remote location. Such a remote control cannot be removed for installation in another piece of equipment and adds a substantial amount to the cost of the equipment. The consumer must bear the expense of this option at the time of purchase of said equipment.

There are also presently available remote control systems which can be retrofitted to entertainment equipment; however, those of these systems known to this inventor require internal connections to the equipment to be remotely controlled or wire connections between the hand-held controller and the equipment. Their use may void the warranty of the controlled equipment.

Calman in U.S. Pat. No. 4,027,249 issued May 31, 1977 on an invention entitled "Vehicle Radio Control Unit" discloses a self-contained control unit for use in an automobile or other vehicle containing a citizen's band radio receiver and an additional audio entertainment appliance such as an AM radio, FM radio, AM/FM radio or audio magnetic tape player. The control unit includes an external speaker for the CP receiver, a plug for insertion in a jack on the CB receiver to connect the external speaker to it, a relay for controlling the operation of the additional audio entertainment applicance and a transistor amplifier and switching circuit connected between the plug and the relay to disable the additional audio entertainment appliance whenever the CB receiver is broadcasting incoming CB signals through the external speaker. This structure essentially comprises an audio operated switch means which disconnects the audio entertainment appliance within an automobile upon the receipt of CB signals and delays the turning on of the audio entertainment appliance following the cessation for a selected time of the incoming audio signals. This structure however is of specialized application and is not suitable for use with television sets or similar equipment.

U.S. Pat. No. 4,305,155 issued Dec. 8, 1981 on an application of Romeo entitled "Exterior Mounted Remote Control Television Channel Selector" discloses a mechanical adapter for insertion over the channel selector knob on a television set to mechanically change the station received by the television set in response to signals transmitted from a hand held control unit. Again, this structure neither turns on or off the television set nor controls the audio volume of the set.

Popular Electronics, February 1981, pages 44 through 50 in an article entitled "Wireless Ad Zap Turns Off TV Commercials" discloses a hand held transmitter for sending a signal to a receiver mounted internally to the television set for enabling the viewer to turn off the sound associated with TV commercials. This particular structure requires internal modifications to the circuitry of the television set and therefore requies access to the interior wiring of the television set thereby possibly voiding its warranty.

Other patents describing certain remote control systems include U.S. Pat. No. 4,112,615 entitled "Remote Control System for a Movable Toy Vehicle", U.S. Pat. No. 4,107,613 entitled "Wireless Microphone with FM Receiver Muting System Responsive to Excessive Undesired AM Level or Low AGC Control Level", U.S. Pat. No. 3,868,639 entitled "Remote Control Receiver Responsive to Sound", U.S. Pat. No. 3,794,985 entitled "Remote Control of a Receiver", U.S. Pat. No. 4,041,400 entitled "Television Remote Control System".

Thus, there exists a need for an improved system and method for the remote control of electronic equipment having an audio output.

SUMMARY OF THE INVENTION

In accordance with this invention, a remote control system is provided which can be easily and quickly installed on any electronic equipment (such as a television receiver) having an audio output and a connection (such as a plug-in receptacle) for an earphone, with no need for any internal connections to said equipment. The remote control system of this invention includes a receiver unit which is connected to the earphone plug on the controlled equipment, and a hand-held transmitter for operating the receiver unit. Preferrably, the transmitter transmits wireless signals to the receiver. Therefore, no wires are required between the transmitter and the receiver unit operatively connected to the controlled equipment through its earphone plug. However, the transmitter could also be connected by wires to the receiver, if desired.

In accordance with one embodiment of this invention, structure for controlling remotely electronic equipment having an audio output and a plug-in receptacle for an earphone comprises a receiver adapted to be connected through the earphone plug on the equipment to be controlled, and a transmitter adapted to control and operate the receiver remotely.

In a second embodiment, the receiver includes, in addition, a power source for supplying power not only to the receiver but also to the equipment to be controlled and an on-off switch for controlling the application of power to both the receiver unit and the equipment to be controlled.

The receiver unit can be either internally powered by use of batteries or can contain a power line cord for connection to any convenient source of AC power.

Furthermore, in one embodiment the transmitter includes an on-off button for turning on or off the controlled equipment (the receiver is always on), and a volume control to allow the user to turn the volume of the audio output signal from the receiver unit up or down as desired.

To install the remote control system of the second embodiment of this invention, the user simply plugs a power supply cord attached to the receiver unit into an AC electrical outlet, removes the AC power cord of the controlled equipment from its AC electrical outlet and connects it to an AC receptacle on the receiver unit, and plugs the earphone jack cable on the receiver unit into the earphone connector on the controlled equipment, thus disabling the internal speaker of the controlled equipment. Hence, installation of the structure of this invention is easy and quick without the need for any tools or particular expertise. Moreover, no internal connections are required to connect the remote control system of this invention to the equipment to be remotely controlled, thereby eliminating the risks and difficulties associated with the prior art remote control equipment requiring internal connection to the equipment to be controlled.

To operate the remote control system and the controlled equipment, the user places the power ON/OFF switch of the controlled equipment in the ON position and adjusts the volume control on the controlled equipment to its minimum volume position. Because the controlled equipment receives its power through the receiver, by simply pressing an ON/OFF button on the hand-held, wireless transmitter, the user can turn on the controlled equipment. To initially adjust the receiver unit for normal volume, the user sets the VOL.ON/OFF control on the transmitter to the ON position and adjusts the volume control on the controlled equipment for the desired volume from the receiver unit (this is a one-time adjustment). To adjust the volume either up or down from a remote location, the user presses either the VOLUME UP or the VOLUME DOWN control on the transmitter, as desired, and holds it in until the desired volume is reached.

One of the objects of the present invention is to provide a means whereby the volume of the acoustical signal from a piece of home entertainment equipment can be remotely increased or decreased.

Another object of the present invention is to provide an improved means whereby the volume of the acoustical signal from a piece of home entertainment equipment can be remotely turned on or off.

Another object of the present invention is to provide an improved remote control system which can be easily and quickly installed on any piece of home entertainment equipment that uses an earphone connector.

More particularly, still another object of the present invention is to provide an improved remote control system which can be installed on any piece of home entertainment equipment containing a plug-in receptacle for earphones, without the need of any tools or special knowledge and without any internal connections to the controlled equipment.

This invention will be more fully understood from the following detailed description taken in conjunction with the drawings.

BRIEF DESCRIPTION OF THE DRAWINGS

FIGS. 8,8A illustrate an application of the remote control system shown in FIG. 4 and shows the relationship among the transmitter unit 1, the receiver unit 4, and a television receiver 8, which is the controlled equipment.

FIG. 9 illustrates the principles of this invention when applied to a stereo system to control the balance and tone of the signals from each of the two speakers.

DETAILED DESCRIPTION OF THE PREFERRED EMBODIMENT

Figure 7:
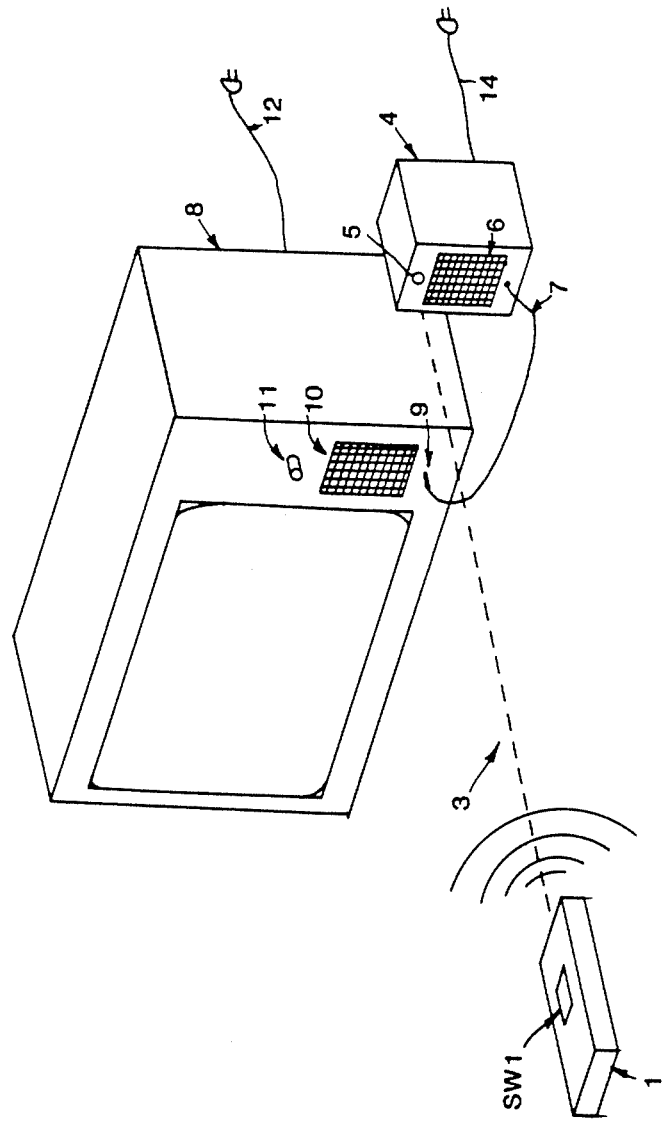
FIG. 7 illustrates an application of the remote control system shown in FIG. 1 and shows the relationship among the transmitter unit 1, the receiver unit 4, and a television receiver 8, which is the controlled equipment.

Referring to FIG. 7, it can be seen that one embodiment of the remote control system of the present invention suitable for controlling only audio volume includes as its principal components a wireless, hand-held transmitter unit 1 containing an audio volume "up" or "down" switch SW1, and a portable receiver unit 4. The enclosures of the transmitter unit 1 and the receiver unit 4 can adopt any of a number of different appearances and are therefore not limited to the configurations shown in FIG. 7.

Figure 1:
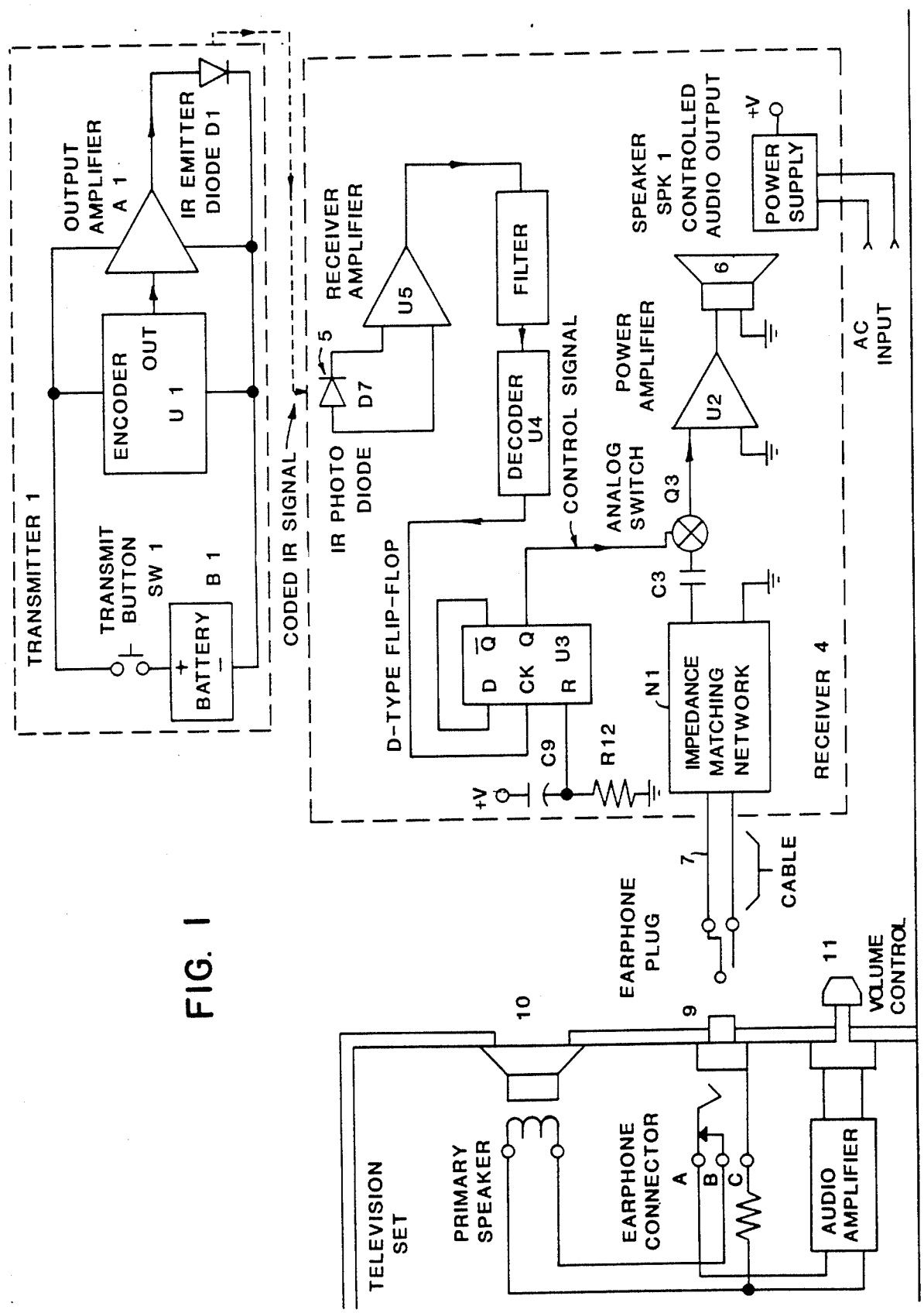
FIG. 1 is a block diagram of a remote control system of this invention shown connected to a television receiver which controls, from a remote location, the audio volume on or off.
Figure 3:
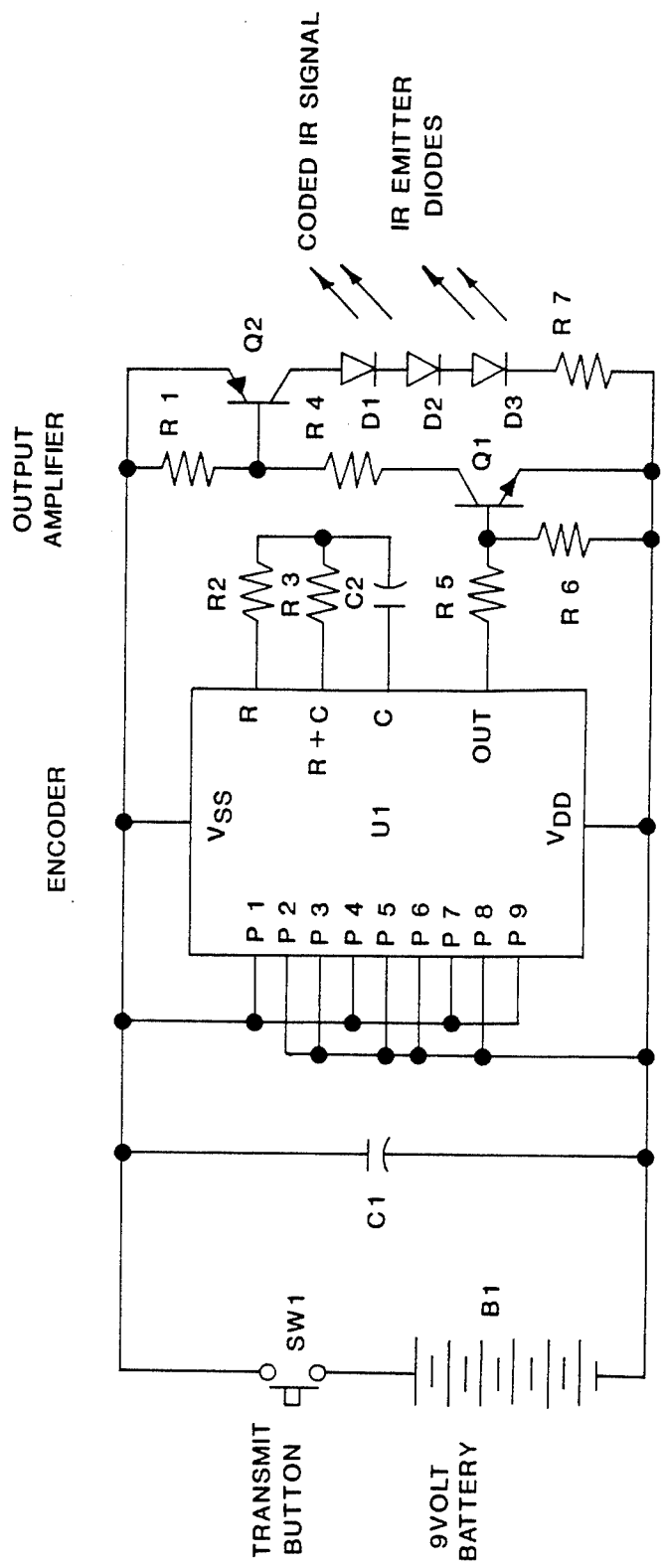
FIG. 3 is a detailed schematic of the transmitter unit in the remote control system FIG. 1.

As can be seen in FIGS. 1 and 3, which depict in more detail the system shown in FIG. 7, the transmitter unit 1 includes a battery B1 (typically nine volts), a transmit pushbutton switch SW1, an encoder circuit U1, and an output amplifier A1 which drives a series of infra-red emitter diodes D1. The method described below of transmitting coded information from the transmitter unit 1 to the receiver unit 4, by using infra-red signals, is just one of a number of methods, which include radio frequency transmission or ultrasonic transmission, that can be used by the remote control system of the present invention.

Figure 2:
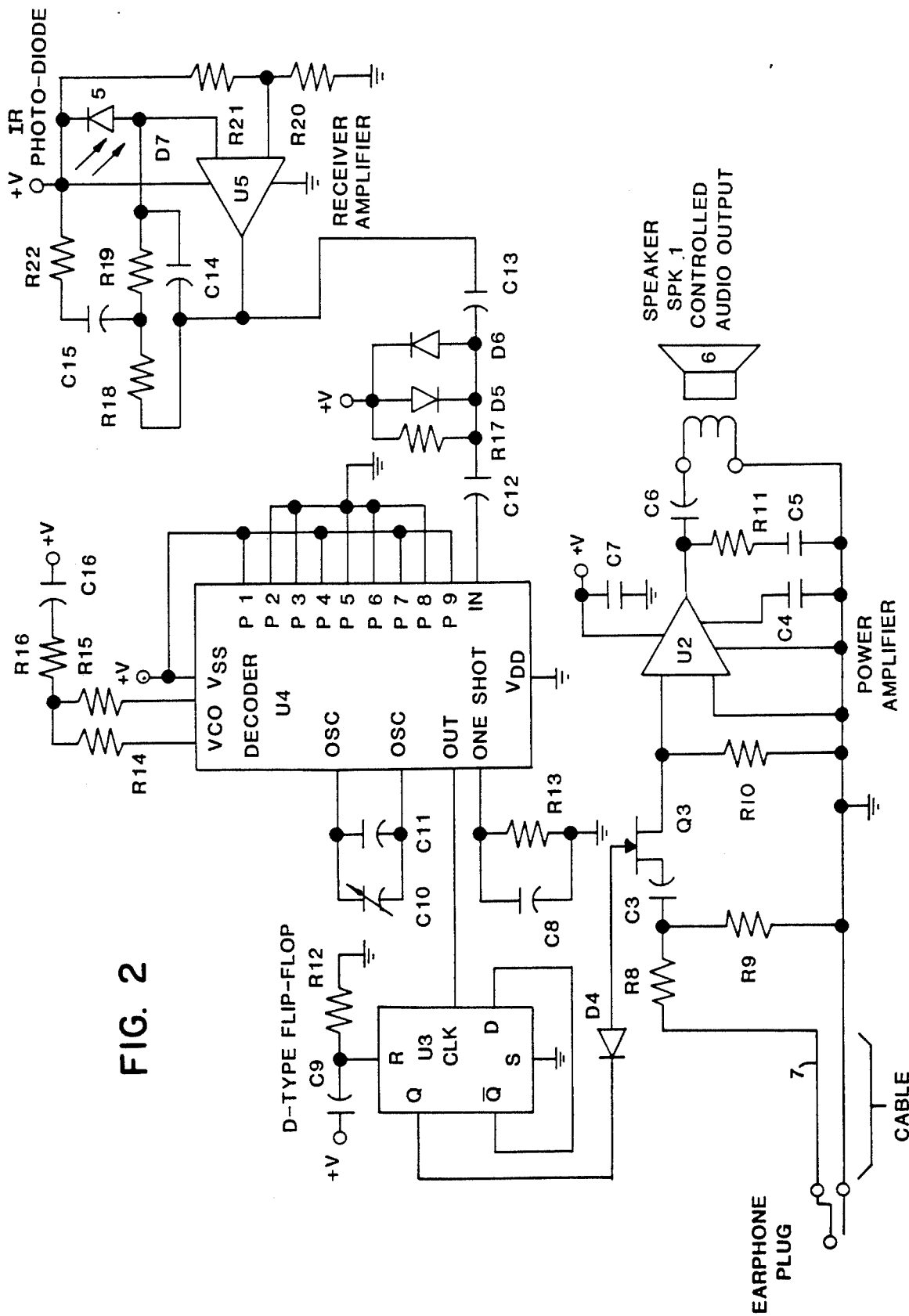
FIG. 2 is a detailed schematic of the receiver unit used in the remote control system of FIG. 1.

The receiver unit 4, as can be seen in FIGS. 1, 2, and 7, includes an infra-red photo diode 5 for receiving signals from the IR emitter diode D1 in transmitter 1, a receiver amplifier circuit U5 for amplifying the signal received by diode 5, a remote control decoder circuit U4, a D-type toggle flip-flop U3, an analog switch Q3, an audio power amplifier U2, a speaker 6, a cable with an earphone plug connected at its end 7, and a power supply to operate the above circuit. The receiver unit 4 includes an enclosure for containing the above mentioned circuits and components, and the enclosure has a decorative front panel as shown in FIG. 7 which features the speaker 6, the infra-red photo diode 5, and the cable/earphone plug 7.

To install the remote control system of FIGS. 1, 2, 3 and 7 on any piece of home entertainment equipment (see FIG. 7) such as a television receiver, the user plugs the power cords 12 and 14 on the television receiver 8 and the receiver unit 4, respectively, into appropriate AC electrical outlets and plugs the earphone plug 7 into the earphone jack 9 of the television receiver 8. When the earphone plug 7 of the receiver unit 4 is plugged into the earphone jack 9 of the television receiver 8, the internal speaker 10 of the television receiver 8 is automatically disabled by a circuit internal to the television receiver 8. The internal speaker 10 of the television receiver 8 remains disabled as long as the earphone plug 7 of the receiver unit 4 is plugged into the earphone jack 9 of the television receiver 8. The speaker 6 of the receiver unit 4 (FIG. 1) can now receive a signal from the television receiver 8 through the earphone plug 7, the impedance matching network N1, and the power amplifier U2. The magnitude of the signal present at the earphone jack 9 and therefore at the earphone plug 7 is controlled by the volume control 11 of the television receiver 8. Thus it can be seen that the remote control system can be installed on any television receiver, and likewise on any piece of home entertainment equipment, without any tools or special knowledge and without any internal connections to the controlled equipment, in a quick and easy manner.

The transmitting and receiving of wireless coded information in general is known by the public at large and is not part of the present invention. Therefore, in the following description of the present invention, the transmitting and receiving of wireless coded information will not be described in detail.

TRANSMITTER UNIT (FIG. 3)

As long as the transmit button SW1 is not depressed, there is no current flow in the transmit unit 1. When the transmit button SW1 is depressed, battery voltage B1 is applied to the circuit and the transmitter unit 1 enters the transmit mode (see FIG. 3). When the transmitter unit enters the transmit mode, the encoder circuit U1 of well-known design outputs (OUT) a serial frequency-shift-keyed data pattern. The code of the data pattern is determined by the wiring of the programming pins (P1 through P9) on encoder unit U1. The serial data pattern drives the output amplifier, made up of transistors Q1 and Q2. The output amplifier in turn provides sufficient current to drive the infra-red light emitting diodes (D1, D2, and D3). The frequency characteristics of the data pattern are determined by the R/C oscillator (R2, R3, and C2) of the encoder U1. Transmitter 1 always transmits the same code to the receiver 4 and decoder U4 contained therein.

In the preferred embodiment encoder U1 comprises the well-known S2743 encoder integrated circuit manufactured and sold by American Microsystems, Inc. of Santa Clara, Calif., and the decoder U4 is the S2742 decoder integrated circuit also manufactured by American Microsystems.

RECEIVER UNIT (FIG. 2)

When the AC power cord 15 (FIG. 7) of the receiver unit 4 (FIGS. 1 and 2) is connected to a convenient AC electrical outlet, the internal power supply comes "on" and provides power to the internal circuitry of the receiver unit 4. When power is initially applied to the internal circuitry of the receiver unit, the following sequence takes place:

1. the D-type flip-flop U3 is forced into the reset state by the power-on-reset components C9 and R12;
2. since the D-type flip-flop U3 is in the reset state, FET Q3, which is being used as an analog switch, is "off", keeping any analog signal on earphone plug/cable 7 from reaching the power amplifier U2 to the speaker 6;
3. at this time, the speaker 6 is "off", and any signal coming from the controlled equipment through the earphone plug/cable 7 cannot be heard.

To remotely turn the speaker 6 "on" and perform the initial volume adjustment, the following is done:

1. the transmitter unit 1 (FIG. 1) is placed in the transmit mode as described above;
2. the infra-red photo diode 5 detects the incoming infr-red serial data pattern from the transmitter unit;
3. the receiver amplifier U5, configured as a current amplifier, with R18 and R19 setting the DC gain, R22 the AC gain, and R20 and R21 providing the high-frequency roll-off, amplifies the detected signal of the infra-red photo diode 5 and couples the signal to the decoder circuit U4 through high pass filter C13 and R17 and clamping circuit D5 and D6;
4. the decoder circuit U4 compares the incoming serial data pattern with the programming pins (P1 through P9) on U4. If a match between the incoming serial data pattern and the programming pins' data pattern is detected, the output pin (OUT) of the decoder circuit U4 toggles the D-type flip-flop U3 into the set state;
5. whenever the D-type flip-flop U3 is in the set state, the FET Q3 is turned "on";
6. with the FET Q3 "on", the incoming signal from the controlled equipment entering through the earphone plug/cable (7) now reaches the power amplifier U2;
7. the power amplifier, in turn, drives the speaker 6. The volume of the audio signal generated by the speaker 6 is dependent on the setting of the volume control on the controlled equipment.

To remotely turn the speaker 6 "off", the transmitter unit 1 is again placed into the transmit mode. Upon detecting a match between the incoming serial data pattern and the programming pins' data pattern, the decoder circuit U4 toggles the D-type flip-flop U3 into the reset state, which turns "off" the FET Q3, which, in turn, turns "off" the speaker 6.

As can be seen from the above, the speaker 6 is turned "on" or "off" by the analog switch Q3, which is controlled by the state of the D-type flip-flop U3, which is toggled by the output (OUT) of the decoder U4. The maximum rate at which the D-type flip-flop U3 may be toggled is determined by the one-shot components C8 and R13 of the decoder circuit U4. At least one R/C time constant of the one-shot components C8, R13 is needed between transmissions from the transmitter unit before decoder circuit U4 can toggle the D-type flip-flop U3.

POWER AND VOLUME CONTROL EMBODIMENT

Figure 4:
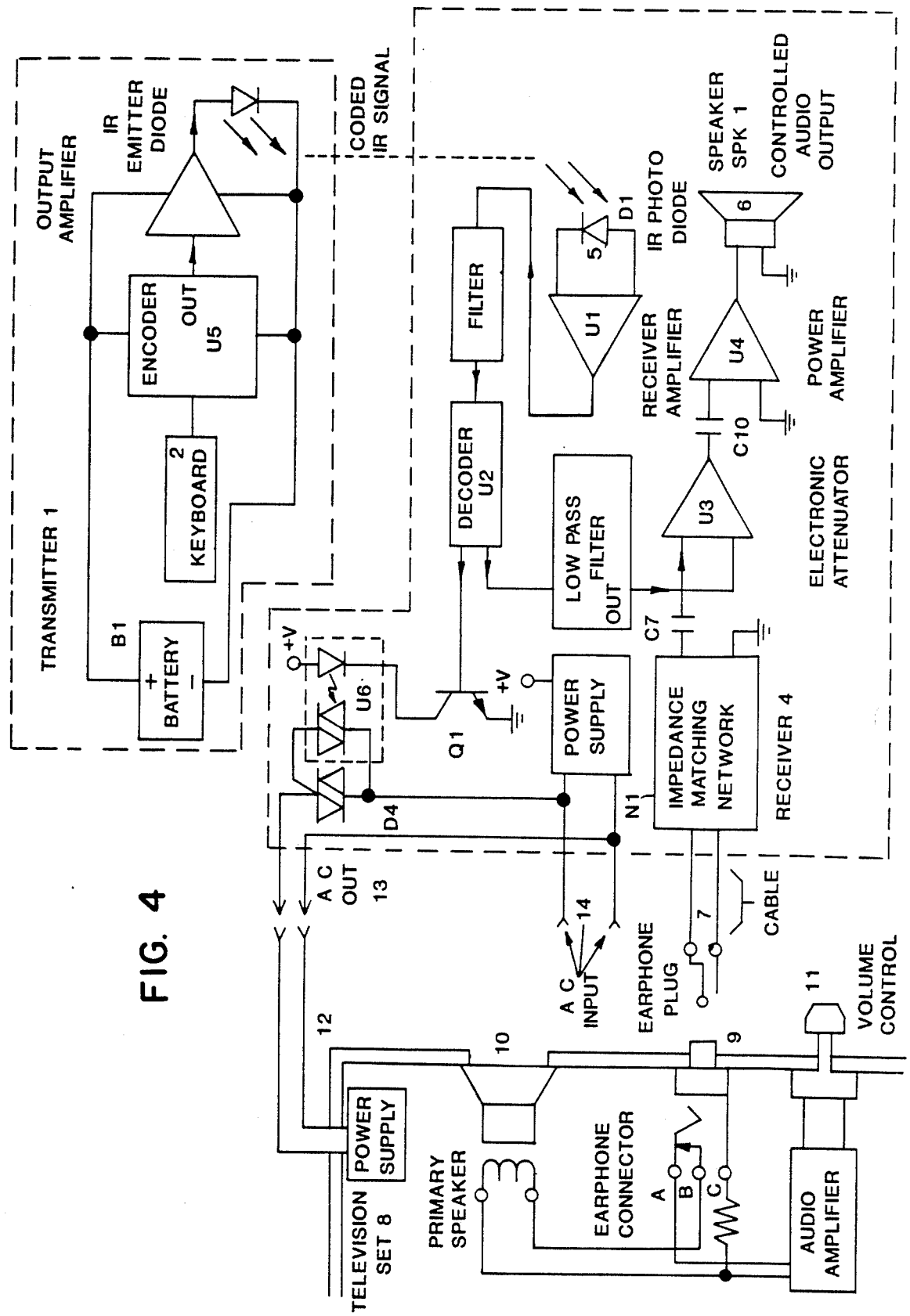
FIG. 4 is a block diagram of a remote control system of this invention shown connected to a television receiver to control, from a remote location, power on or off, audio volume up or down, and audio volume on or off.
Figure 6:
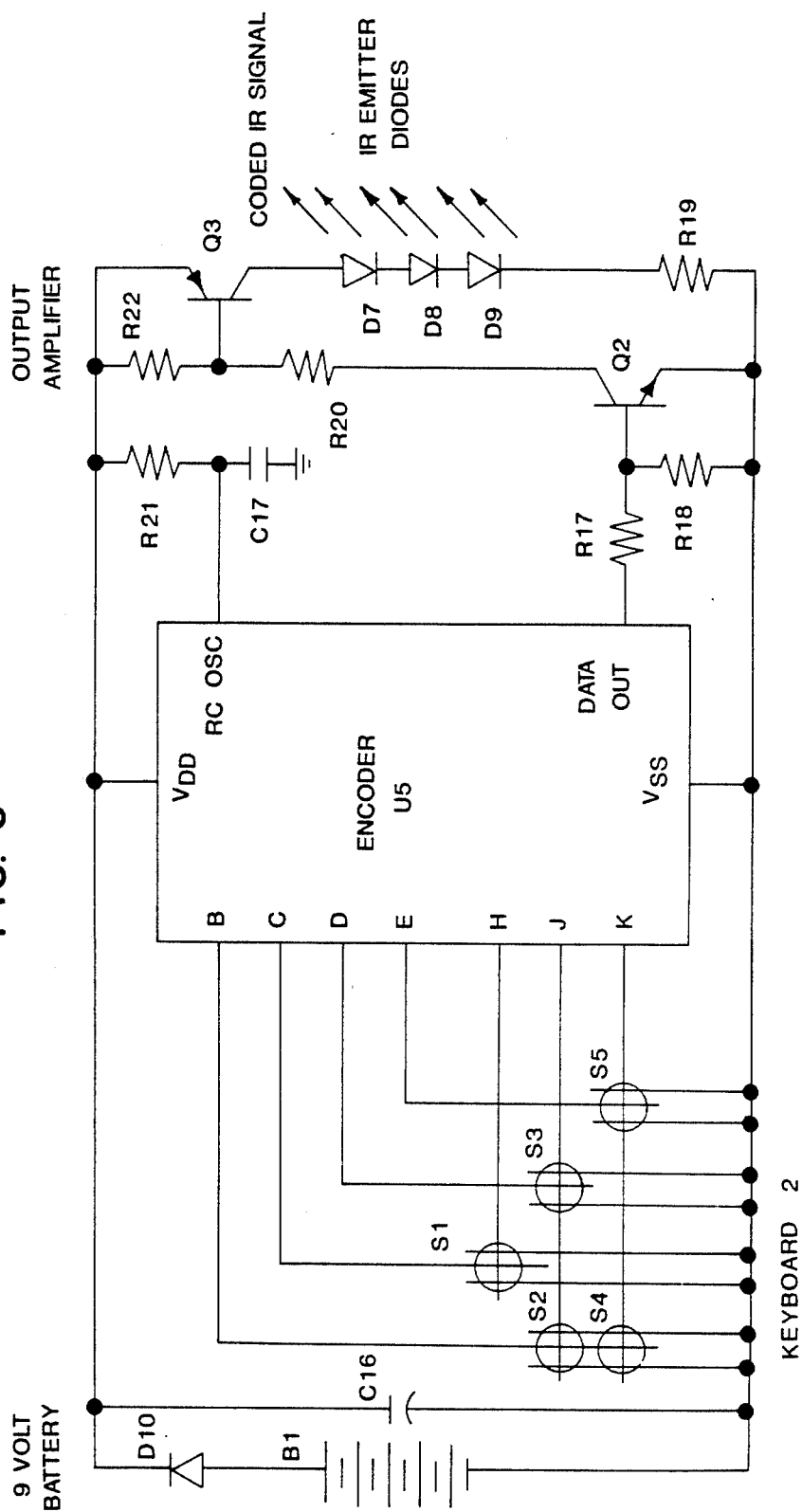
FIG. 6 is a detailed schematic of the transmitter unit used in the remote control system of FIG. 4.

Referring to the drawings, FIGS. 4 and 8, it can be seen that another embodiment of the remote control system of the present invention includes as its principal components a wireless, hand-held transmitter unit 1 and a portable receiver unit 4. The enclosures of the transmitter unit 1 and the receiver unit 4 can be any of a number of different configurations and therefore are not limited to the configuration shown in FIG. 8. As can be seen in FIGS. 4 and 6, the transmitter unit 1 includes a nine-volt battery B1, a keyboard 2 containing switches S1 to S5, an encoder circuit U5, and an output amplifier which drives a series of infra-red emitter diodes. The method (described below) of transmitting coded information from the transmitter unit 1 to the receiver unit 4 uses infra-red signals. Of course, other methods, such as radio frequency transmission and ultrasonic transmission, can be used by the remote control system of the present invention.

Figure 5:
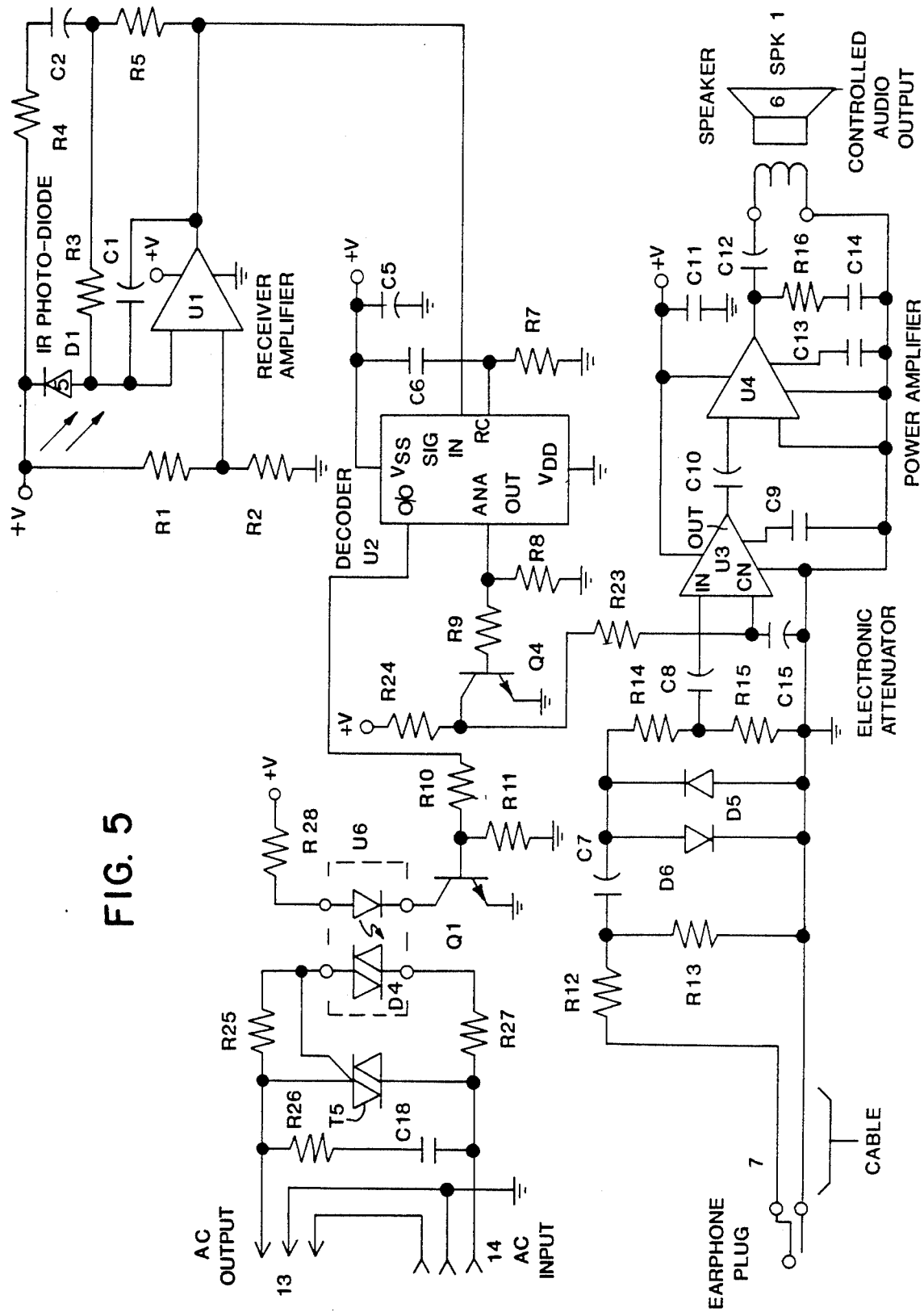
FIG. 5 is a detailed schematic of the receiver unit used in the remote control system of FIG. 4.

The receiver unit 4, as can be seen in FIGS. 4, 5 and 8, includes an infra-red photo diode 5, a receiver amplifier circuit U1, a remote control decoder circuit U2, an AC on/off relay U6 which in the preferred embodiment is replaced by a triac, an electronic attenuator U3, a power amplifier U4, a speaker 6, a cable with an earphone plug connected at its end 7, an AC input cable 14, an AC outlet 13, and a power supply to operate the above circuit. The receiver unit 4 includes an enclosure (FIG. 8) for containing the above mentioned circuits and components, and the enclosure has a decorative front panel which features the speaker 6, the infra-red photo diode 5, and the cable/earphone plug 7.

To install the remote control system of the present invention on any piece of home entertainment equipment, such as a television receiver (see FIG. 8), the user removes the power cord 12 of the television receiver 8 from the conventional AC outlet and connects it to the AC electrical outlet 13 (FIG. 4) of the receiver unit 4. The power cord 14 of the receiver unit 4 is plugged into any AC electrical outlet. The on-off/volume control 11 of the television receiver 8 is left in the "on" position. With the power cord 12 of the television receiver 8 plugged into the AC electrical outlet 13 (FIG. 4) of the receiver unit 4, it can be seen that the AC power supplied to the television receiver 8 is controlled by the receiver unit 4. To complete installation of the remote control system, the user plugs the earphone plug 7 on the receiver unit 4 into the earphone jack 9 of the television receiver 8. When the earphone plug 7 of the receiver unit 4 is plugged into the earphone jack 9 of the television receiver 8, the internal speaker 10 of the television receiver 8 becomes disabled. The internal speaker 10 of the television receiver 8 remains disabled as long as the earphone plug 7 of the receiver unit 4 is plugged into the earphone jack 9 of the television receiver 8. The speaker 6 of the receiver unit 4 can now receive a signal from the television receiver 8 through the earphone plug 7, the impedance matching network N1, the electronic attenuator U3, and the power amplifier U4. The magnitude of the signal present at the earphone jack 9, and therefore at the earphone plug 7, is controlled by the volume control 11 of the television receiver 8.

Thus, it can be seen that the remote control system can be installed on any television receiver, and likewise on any piece of home entertainment equipment, without any tools or special knowledge, and without any internal connections to the controlled equipment, in a quick and easy manner.

The transmitting and receiving of wireless coded information is known by the public at large and thus is not described here in detail.

TRANSMITTER UNIT (FIG. 6)

With no keyboard buttons S1-S5 pressed, the transmitter is in the standby mode, and therefore the infra-red diodes D7-D9 are emitting no energy. While three infra-red diodes are shown in FIG. 4, only one such diode is required. However, if only one such diode is used, a resistive element must be placed in series with this diode and the energy dissipated in the resistor is wasted. Use of three diodes converts energy which would otherwise be wasted into transmitted energy and thus improves the efficiency of the device. Whenever a keyboard button S1-S5 is pressed, the RC oscillator (comprising in part resistor R21 and capacitor C17) on the encoder circuit U5 starts. The frequency of the RC oscillator is determined by R21 and C17. After the RC oscillator has started, the encoder circuit U5 outputs (DATA OUT) a pulse-code-modulated signal, having a recurring pattern, which is unique to the particular keyboard button S1-S5 being pressed. The pulse-code-modulated signal drives the output amplifier, made up of transistors Q2 and Q3. The output amplifier, in turn, provides sufficient current to drive the infra-red light emitting diodes (D7, D8 and D9) which emit the coded infra-red signal. Diode D10 protects the transmitter from damage if the battery is inserted backwards.

RECEIVER UNIT (FIG. 5)

When the AC power cord 14 of the receiver unit is connected to a convenient AC electrical outlet, the internal power supply comes "on" and provides power to the internal circuitry of the receiver unit. When power is initially applied to the internal circuitry of the receiver unit, the following sequence takes place: The decoder circuit U2 performs a power-on-reset function, which causes the On/Off output pin O/O to go to the logical "0" (zero) state, which keeps transistor Q1 "off" and, therefore, triac D4 is "off." When triac D4 is "off", there is no AC power available at the AC electrical outlet 13, thus causing the television receiver, which is connected to said outlet, to be in the power "off" state. The power-on-reset function of the decoder circuit U2 also causes the Analog A (ANA OUT) pin of the decoder circuit U2 to go to 0% duty factor (zero volts), which keeps transistor Q4 "off", causing maximum voltage to develop across capacitor C15, through resistors R23 and R24, which, in turn, sets the electronic attenuator U3 to maximum attenuation. Hence, after power has been applied to the receiver unit 4 (FIG. 4), and before any transmitted information has been received by the decoder circuit U2, the speaker 6 and the AC electrical outlet 13 of the receiver unit 4 are "off." At this time, the television receiver is in the power "off" state, even though its on-off/volume control is in the "on" position.

To remotely turn "on" the television receiver, or to place the television receiver in the power "on" state, the user depresses the On/Off button S1 of the transmitter unit (see FIGS. 6 and 8) causing the transmitter unit 1 to emit an infra-red pulse code-modulated signal, which is unique to the button S1. The incoming infra-red pulse code-modulated signal reaches the receiver unit and is detected by the infra-red photo diode 5. The receiver amplifier U1, configured as a current amplifier, with R3 and R5 setting the DC gain, R4 the AC gain and with R1 and R2 providing the high-frequency roll-off, amplifies the detected signal of the infra-red photo diode 5 and couples the signal to the decoder circuit U2. The decoder circuit U2 decodes the incoming pulse code-modulated signal, which is unique to the On/Off button S1 of the transmitter unit, causing the On/Off output pin O/O to go to the logic "1" (one) state, which causes transistor Q1 to turn "on" and, therefore, triac D4 to turn "on" due to collecter current of Q1 through IR diode U6 and resistor R28 causing current through triac T5 to trigger on traic D4. When triac D4 is "on", AC power is delivered to the television receiver through the AC electrical outlet 13, causing the television receiver to be in the power "on" state. Subsequent pressing of the On/Off button S1 on the transmitter unit will "toggle" the triac D4, causing the television receiver to be placed in successive power "off" and power "on" states.

To remotely adjust the television receiver to "normal" volume, the television receiver must be in the power "on" state. When the NORMAL VOL. button S2 of the transmitter unit (see FIGS. 6 and 8) is depressed, the transmitter unit emits an infra-red pulse code-modulated signal which is unique to the button S2. Upon decoding the incoming signal, the decoder circuit U2 causes the Analog A pin (ANA OUT) to oscillate at a frequency of 10 KHz, with a duty factor of 50%. The Analog A output signal is inverted by transistor Q4. R23 and C15 form a low-pass filter which converts the 10 KHz at 50% duty factor to a DC voltage. This DC voltage on the CONTROL pin (CN) causes the electronic attenuator U3 to be placed in the "normal" attenuation state. When the electronic attenuator circuit U3 is in the "normal" attenuation state, the volume control on the television receiver is adjusted by the user until "normal" volume is heard from the speaker 6 on the receiver unit. The signal path of the audio signal, from the television receiver to the speaker 6 of the receiver unit, is as follows:

When the earphone plug 7 of the receiver unit is plugged into the earphone connector 9 of the television receiver 8 (see FIG. 4), the audio signal output from the television receiver audio amplifier is diverted from the television receiver's internal speaker 10 to the earphone plug 7, the impedance matching network R12 and R13 (FIG. 5), and the electronic attenuator circuit U3 input pin (IN). The level of audio signal allowed to pass through the electronic attenuator circuit U3, from the INPUT (IN) pin to the OUTPUT (OUT) pin, is dependent upon the DC voltage level present on the CONTROL (CN) pin. With the Analog A (ANA OUT) pin of the decoder circuit U2 outputting a signal whose duty factor is 50%, the DC voltage level developed at the CONTROL (CN) pin of the electronic attenuator U3 causes the attenuator to be placed in the "normal" attenuation state. The audio signal leaving the OUTPUT (OUT) pin of the electronic attenuator circuit U3 is coupled through capacitor C10 and amplified by the power amplifier circuit U4, which drives the speaker 6.

To remotely turn the speaker 6 of the receiver unit "off", the user depresses the VOL.ON/OFF button S4 on the transmitter unit (FIG. 6), causing the transmitter unit 1 to emit an infra-red pulse code-modulated signal which is unique to the button S4. Upon decoding the incoming signal, the decoder circuit U2 forces the Analog A pin (ANA OUT) to 0% duty factor, or zero volts. With 0% duty factor present on the Analog A (ANA OUT) pin, transistor Q4 is turned "off". With transistor Q4 "off", maximum voltage is developed across capacitor C15, causing maximum voltage at the control (CN) pin of the electronic attenuator circuit U3. With maximum voltage on the Control (CN) pin, the electronic attenuator circuit U3 is in the maximum attenuation state, causing the attenuator to pass no signal from the Input (IN) pin to the output (OUT) pin. With no signal present on the Output (OUT) pin of the electronic attenuator circuit U3, the speaker 6 is "off." Subsequent pressing of the VOL.ON/OFF button S4 on the transmitter unit will "toggle" the Analog A pin (ANA OUT) of the decoder circuit U2 from 0% duty factor to the original duty factor and back again to 0% duty factor. Hence, the VOL.ON/OFF button implements the "sound killer" feature.

To remotely increase or decrease the volume of the speaker 6 on the receiver unit, the user depressed the VOLUME UP button S3 (FIG. 6) or the VOLUME DOWN button S5 on the transmitter unit, causing the transmitter unit to emit an infra-red pulse code-modulated signal which is unique to button S3 or S5. Upon detecting the incoming pulse code-modulated signal, the Analog A pin (ANA OUT) of the decoder circuit U2 changes duty factor. As the VOLUME UP button S3 on the transmitter unit is depressed and held in, the duty factor of the Analog A pin (ANA OUT) increases, causing the DC voltage level present at the Control pin (CN) of the electronic attenuator circuit U3 to decrease. As the control voltage decreases, the attenuation of the electronic attenuator circuit U3 decreases, causing more of the audio signal from the television receiver to reach the power amplifier circuit U4. When the VOLUME UP button S3 on the transmitter unit is released, the duty factor of the Analog A pin (ANA OUT) stops increasing and remains stable. As the VOLUME DOWN button S5 on the transmitter unit is depressed and held in, the duty factor of the Analog A pin (ANA OUT) decreases, causing the DC voltage level present at the Control (CN) pin of the electron attenuator circuit U3 to increase. As the control voltage increases, the attenuation of the electronic attenuator circuit U3 increases, causing less of the audio signal from the television receiver to reach the power amplifier circuit U4. When the VOLUME DOWN button S5 on the transmitter unit is released, the duty factor of the Analog A pin (ANA OUT) stops decreasing and remains stable.

In the transmitter unit 1 of the second embodiment described above (the embodiment shown in FIGS. 4, 5, 6 and 8), the encoder circuit U5 used is the American Microsystems, Inc. S2600 encoder integrated circuit. The characteristics of this product are well known and are described in American Microsystems, Inc.'s Advanced Product Description Data Sheet, the contents of which are hereby incorporated by reference. Capacitor C16 (FIG. 6) functions as a filter capacitor across the power supply lines. Resistor R19 (FIG. 6) limits the current through the three infrared light emitting diodes (D7, D8 and D9) to a safe level thereby to prevent the burn out of these diodes. Essentially with a nine (9) volt battery, the current through D7, D8 and D9 (which in the preferred embodiment comprise Texas Instruments TIL31 infrared emitting diodes) is a little too large compared to the design current for these diodes. A fourth diode in series would result in too little current for the purposes of this invention and thus resistor R19 (about 5 ohms) is added to control the current to the desired value.

Resistors R17 and R18 connected to the DATA OUT lead from encoder U5 control the bias current to transistor Q2.

Resistors R20 and R22 control the bias current to transistor Q3 when transistor Q2 is on.

The above circuit components are described in the AMI product description for the S2600 and S2601 encoder/decoder remote control chips.

The receiving unit shown in FIG. 5 uses as a receiver amplifier U1 an RCA CA3140 operational amplifier integrated circuit. The data sheet for this product is hereby incorporated by reference. Of course, other receiver amplifiers of equivalent performance are available on the market. The decoder circuit U2 used in FIG. 5 is the AMI S2601 decoder integrated circuit. Again, the S2601 data sheet is incorporated herein by reference.

Resistor R7 and Capacitor C6 in FIG. 5 set the frequency of oscillation of the decoder U2, RC oscillator. This oscillator provides a clock signal to U2. When the incoming signal received by diode D1 matches in frequency the frequency of this clock, decoder U2 locks on to the received signal and decodes it appropriately. Resistors R10 and R11 control the bias current to transistor Q1 from the on/off output pin (O/O) of the decoder circuit U2. Transistor Q1 controls the current through the triac U6 and particularly the light emitting diode contained therein. Triac driver U6 optically couples the signal through Q1 to a triac T5 contained within the triac driver thereby to provide electrical isolation in the system of a type required to obtain Underwriter Laboratory Approval.

Capacitor C5 functions as a filter capacitor for the power supply to the decoder circuit U2. Resistor R8 and R9 control the bias current to transistor Q4 from the analog A output pin (ANA OUT) of the decoder circuit U2.

The electronic attenuator U3 is a Motorola MC3340 Electronic Attenuator Integrater Circuit. The data sheet associated with this product is hereby incorporated by reference. The power amplifier U4 is a National Semiconductor LM384 Audio Power Amplifier integrated circuit. The data sheet associated with this product is also incorporated by reference.

Resistors R12 and R13 in Network N1 comprise an impedance matching network between the receiver unit and the controlled equipment and also function as a voltage divider. Capacitor C7 is a coupling capacitor which couples the AC voltage developed across Resistor R13 by the controlled equipment to the input circuit of the electronic attenuator U3. Diodes D5 and D6 are clamping diodes which prevent the AC input signal from Capacitor C7 from exceeding one forward biased diode drop in either direction about ground. Resistors R14 and R15 are a voltage divider. Capacitor C8 couples the AC voltage developed across Resistor R15 to the input pin (IN) of the electronic attenuator U3. Capacitor C9 controls the high frequency response of the electronic attenuator U3. Capacitor C10 couples the AC output signal from the electronic attenuator U3 to the input of the power amplifier U4. Capacitor C11 is used as a filter capacitor at power pins of both the electronic attenuator U3 and the power amplifier U4. Capacitor C12 couples the AC output signal from power amplifier U4 to the speaker 6. Capacitors C13 and C14 and Resistor R16 adjust the frequency characteristics of the power amplifier.

The concepts of this invention so far have been described in conjunction with a monaural audio output signal whether or not the audio output signal is generated by one or more speakers. However, another embodiment of this invention is particularly useful in stereo applications wherein the user is provided with means for controlling independently the balance and tone of each of two stereo speakers. In accordance with this embodiment, the same transmitting unit as described above in conjunction with the embodiments of FIGS. 1 and 4 can be employed but the encoder circuits U1 and U5 in the transmitters of FIGS. 1 and 4, respectively are utilized to send uniquely encoded signals to a receiver mounted in each of the two externally mounted stereo speakers to control independently the volume and tone of each speaker. The encoders have a sufficient number of codes to allow not only the volume of each stereo speaker to be controlled independently but also to allow the tone quality (i.e. base and treble) to be controlled independently for each speaker. Thus, the signals from one transmitter can be used to control both the balance and the tone of each of two speakers in a stereo system. A system for this purpose is illustrated in FIG. 9. As illustrated in FIG. 9, a stereo plug 93 is adapted to be inserted into the plug-in earphone receptacle on the stereo amplifier thereby cutting off the power to the external speakers normally used with the stereo amplifier. The audio signal from the stereo amplifier is then transmitted over lines 94a and 94b to special receiver units 91a and 91b in accordance with this invention, each containing a speaker and associated control receiving and control circuitry. Each receiving unit 91a and 91b can be identical in structure to the receiving unit shown for example in either FIG. 1 or FIG. 4 and shown in more detail, for example, in FIG. 2 or FIG. 5. The receiving units 91a and 91b contain structure for receiving signals transmitted from transmitter unit 92 controlled by the user. Thus receiving unit 91a contains a light receiving diode and circuitry for amplifying and operating upon the signal detected by said light receiving diode together with an amplifier for amplifying the audio signal received from the stereo amplifier on lead 94a so as to produce an output signal from the speaker 95a contained within the receiver unit 91a. Similarly receiver unit 91b receives signal from transmitter 92 uniquely encoded to activate only receiving unit 91b and operates upon these signals in a manner described above in conjunction with the structure of FIG. 1 or 4 to amplify appropriately the audio signal received from the stereo amplifier on lead 94b prior to transmitting this signal to drive speaker 95b. The transmitter 92 contains a speaker switch 96 which enables the user to determine which of the two speakers 91a and 91b will be activated by the signals to be transmitted from transmitter 92. The encoder such as encoder U1 (FIG. 1) or U5 (FIG. 4) within transmitter 92 is capable of producing a number of different coded signals. When switch 96 is set to transmit to speaker A, a first set of coded signals is transmitted to receiver unit 91a. Receiver unit 91b is insensitive to these signals and will not respond. Likewise when switch 96 is set at B, the signals transmitted from transmitter 92 will be received and acted upon only by receiving unit 91b. Thus, the user is able to independently control the volume produced by each of the two receiving units 91a and 91b and the tone (i.e. the base and treble) of these two units.

As will be apparent from the above, this invention provides a means by which a viewer or listener to the audio output signal of an electronic home entertainment system can turn off the audio output or control the audio volume by making use of the earphone plug on the system. Thus, this invention converts home entertainment equipment without a remote control of volume into equipment with such control. Thus, this invention will be particularly useful by invalids or people unable to reach easily the home entertainment system to turn down or off the volume (such as during advertisements or to answer the phone).

While several embodiments of this invention have been described, other embodiments will be obvious in view of this disclosure. This specification is intended to be illustrative and not limiting.

I claim:

1. Structure for remotely controlling selected functions of electronic equipment containing an internal means for producing a first audio output signal discernable by a plurality of listeners and a connector for earphones such that when earphones are connected to said connector for earphones said internal means for producing a first audio output signal is disabled and an electrical signal containing audio information is transmitted to said earphones, which comprises second means, external to said electronic equipment, for producing a second audio output signal, connector means for connecting said second means for producing a second audio output signal to the connector for earphones on said electronic equipment, thereby to disable said internal means for producing a first audio output signal on said electronic equipment and to transmit said electrical signal containing audio information produced by said electronic equipment to said second means for producing a second audio output signal, means for turning on and off said second means for producing a second audio output signal thereby to turn on and off said second audio output signal, and means, to be operated by a user, for transmitting signals to said means for turning on and off said second means for producing, thereby to allow a user to remotely control the presence or absence of said second audio output signal.

2. Structure as in claim 1 wherein said second means for producing includes a power means for connecting to a source of AC power and plug recepticle means for receiving the power cord from said electronic equipment to be remotely controlled, and means for turning on and off the power to said electronic equipment being remotely controlled in response to signals received by said second means for producing from said means for transmitting thereby to turn on or off said electronic equipment.

3. Structure as in claim 2 including means, to be operated by a user, for transmitting signals to said second means for producing, to control the amplitude of the audio output signal produced by said second means for producing and means for controlling the amplitude of said audio output signal produced by said second means for producing in response to said signals from said means for transmitting.

4. Structure as in claim 1 wherein said means for transmitting comprises a hand held battery powered transmitting unit containing at least one infrared emitting diode and said second means for producing contains an infrared receiving diode, thereby to allow signals to be transmitted from said means for transmitting to said means for receiving without any wire connection between the two structures.

5. Structure for remotely controlling selected functions of electronic equipment containing an internal means for producing a first audio output signal discernable by a plurality of listeners and a connector for earphones such that when earphones are connected to said connector for earphones said internal means for producing a first audio output signal is disabled and an electrical signal containing audio information is transmitted to said earphones, which comprises second means, external to said electronic equipment, for producing a second audio output signal, connector means for connecting said second means for producing a second audio output signal to the connector for earphones on said electronic equipment, thereby to disable said internal means for producing a first audio output signal on said electronic equipment and to transmit said electrical signal containing audio information produced by said electronic equipment to said second means for producing a second audio output signal, means for turning on and off said second means for producing a second audio output signal thereby to turn on and off said second audio output signal, means, to be operated by a user, for transmitting signals to said means for turning on and off said second means for producing, thereby to allow a user to remotely control the presence or absence of said second audio output signal, wherein said means for transmitting comprises a hand held battery powered transmitting unit containing at least one infrared emitting diode and said second means for producing contains an infrared receiving diode, thereby to allow signals to be transmitted from said means for transmitting to said means for receiving without any wire connection between the two structures, and wherein said second means for producing an audio output signal comprises power amplifier means for amplifying the audio signal transmitted from said electronic equipment over said means for connecting to said second means for producing;

switch means for passing said audio signal from said electronic equipment to said power amplifier;

speaker means connected to said power amplifier means for producing said external audio output signal;

means for receiving any one of a plurality of coded signals and for adjusting in response to the received coded signal the amplitude of said external output signal produced by said speaker means and means for decoding the received coded signal and for adjusting said power amplifier means in response to the received coded signal to produce from said speaker means an external audio output signal with the desired amplitude.

6. Structure as in claim 1 wherein said means for transmitting comprises a source of power;

a transmit button for connecting said source of power to the transmitting circuitry, said transmitting circuitry comprising an encoder for producing a coded signal to be transmitted to said second means for producing; and at least one infrared emitting diode for transmitting in the form of infrared signals to said second means for producing the coded signal thereby to turn on or off the audio output signal produced by said second means for producing.

7. In combination a selected piece of electronic equipment containing an internal audio output system for producing an output signal audible to a plurality of listeners, and a connector for earphones, said connector for earphones being adapted to receive a plug connected to earphones and thus to disable said internal audio output signal;

a control unit connected to said electronic equipment by means of a cable extending from said control unit to said connector for earphones, said cable including on one end a plug for insertion into said connector for earphones, thereby to disable said internal audio output system in said electronic equipment, while at the same time directing the electrical signal which drives the internal audio output system to said control unit through said connector for earphones, said plug and said cable, said control unit comprising external means for producing an audio output signal and means for receiving signals for controlling said audio output signal; and means, controllable by a user, for transmitting said signals for controlling said audio output signal to said means for receiving in said control unit.

8. Structure as in claim 7 wherein said means for transmitting comprises means for transmitting a signal to control the volume of said audio output signal.

9. Structure as in claim 7 wherein said means for transmitting transmits signals for turning on and turning off said audio output signal.

10. Structure as in claim 8 wherein said means for transmitting also transmits signals for turning on and turning off said audio output signal.

* * * * *